US011876516B2

(12) United States Patent
Lee et al.

(10) Patent No.: US 11,876,516 B2
(45) Date of Patent: Jan. 16, 2024

(54) NON-FIGHTING LEVEL SHIFTERS

(71) Applicant: Synopsys, Inc., Mountain View, CA (US)

(72) Inventors: Peter Kwang Lee, Pleasanton, CA (US); Kapil Dev Dwivedi, Mirzapur (IN); John Edward Barth, Williston, VT (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/525,345

(22) Filed: Nov. 12, 2021

(65) Prior Publication Data

US 2022/0158638 A1    May 19, 2022

Related U.S. Application Data

(60) Provisional application No. 63/113,489, filed on Nov. 13, 2020.

(51) Int. Cl.
*H03K 19/0185* (2006.01)
*H03K 3/037* (2006.01)

(52) U.S. Cl.
CPC ..... *H03K 19/018521* (2013.01); *H03K 3/037* (2013.01)

(58) Field of Classification Search
CPC .................... H03K 19/0185–018528
See application file for complete search history.

(56) References Cited

U.S. PATENT DOCUMENTS

| | | | |
|---|---|---|---|
| 6,842,043 B1* | 1/2005 | Nguyen | H03K 3/356113 326/70 |
| 7,348,801 B2* | 3/2008 | Nojiri | H03K 3/012 326/68 |
| 7,880,500 B2* | 2/2011 | Monk | H03K 3/356182 327/333 |
| 9,825,634 B2* | 11/2017 | Hong | H03K 3/356113 |

FOREIGN PATENT DOCUMENTS

TW     201743561    * 12/2017  ..... H03K 19/018507

* cited by examiner

*Primary Examiner* — Patrick O Neill
(74) *Attorney, Agent, or Firm* — Lowenstein Sandler LLP

(57) ABSTRACT

A level shifter circuit includes a first current mirror coupled between a power terminal and a ground terminal, a second current mirror coupled between the power terminal and the ground terminal, and a level shifter. The level shifter includes a first transistor coupled to the first current mirror and a second transistor coupled to the second current mirror. The first current mirror and the second current mirror control a state of the first transistor and the second transistor.

20 Claims, 17 Drawing Sheets

NON-FIGHTING LEVEL SHIFTERS

CROSS-REFERENCE TO RELATED APPLICATIONS

The present application claims the benefit under 35 U.S.C. § 119(e) of U.S. Provisional Patent Application No. 63/113,489 filed on Nov. 13, 2020, which is incorporated herein by reference in its entirety for all purposes.

TECHNICAL FIELD

The present disclosure relates to integrated circuits (ICs). More particularly, the disclosure relates to non-fighting level shifter circuits for ICs.

BACKGROUND

Integrated circuits (ICs) frequently include circuits that operate at different power levels. For example, input/output (I/O) circuits frequently operate at a higher voltage than circuits in the core of the IC. A level shifter circuit may be used when an IC includes signals generated by a circuit at a first power level that are then provided to another circuit operating at a higher or a lower power level. For example, the level shifter can receive an input signal having a lower power level and provide an output signal having a higher power level.

SUMMARY

In one aspect, a level shifter circuit includes a first current mirror coupled between a power terminal and a ground terminal, a second current mirror coupled between the power terminal and the ground terminal, and a level shifter. The level shifter includes a first transistor coupled to the first current mirror and a second transistor coupled to the second current mirror. The first current mirror and the second current mirror control a state of the first transistor and the second transistor.

In one aspect, a level shifter circuit includes a current mirror and a level shifter. The current mirror is coupled between a power terminal and a ground terminal. The current mirror includes a first n-type transistor gated by an input signal and a second n-type transistor gated by an inverse of the input signal. The level shifter includes a first p-type transistor and a second p-type transistor. The current mirror circuit is configured to control a voltage at a gate of the first p-type transistor and/or the second p-type transistor.

In one aspect, an input/output (I/O) circuit includes a level shifter and a high voltage transistor. The level shifter includes a first current mirror, a second current mirror, and a level shifter section. The first current mirror is coupled between a power terminal and a ground terminal. The second current mirror is coupled between the power terminal and the ground terminal. The level shifter section includes a first transistor coupled to the first current mirror and a second transistor coupled to the second current mirror. The first current mirror and the second current mirror control a state of the first transistor and the second transistor. The high voltage transistor is coupled to a drain of the first transistor and a second high voltage transistor coupled to the drain of the second transistor.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to non-fighting level shifters with an unlimited voltage range of operation.

In a static random access memory (SRAM)'s dual rail mode, a peripheral voltage supply VDDP (low voltage level) is lowered while an array voltage supply VDDA (high voltage level) remains high for power saving. Level shifters are typically used to maximize a delta between VDDA and VDDP. The lower the minimum VDDP, the more the power saving in VDDP domain is. The greater the delta between VDDA and VDDP, the greater the performance of circuits in VDDA domain is. Key characteristics of level shifters include a maximum operating voltage delta between VDDA and VDDP, and a minimum voltage of operation for VDDP. Other considerations include area, standby leakage power, switching power, and speed.

In a level shifter, when an input signal changes from a low value to a high value, one or more transistors may be on. An n-transistor may try to pull down a node while a p-transistor may try to pull up the node. This may be referred to as fighting between the transistors. Level shifters may require n-type transistors to fight against p-type transistors to win to be operational. Fighting between transistors may limit an operating voltage range or delta of the level shifters.

The non-fighting level shifters described herein eliminate the fighting between transistors and thus remove the limitation on the operating voltage range. The non-fighting level shifters include a current mirror section that assures that the n-type transistors win without fighting. The current mirror section may control the state (on/off) of the transistors in the level shifter by guaranteeing a voltage level at the respective gate.

Embodiments disclosed herein solve the problem of a limited operating range in level shifters. The level shifters described herein can be used in SRAM's, other memory IP's, input/output (TO) pads, or any device IPs that require transmission of data from one voltage domain to another without limitation on the operating voltage range. By eliminating fighting, the minimum VDDP can be as low as a threshold voltage (Vt) of the transistor, and VDDA-VDDP delta is unlimited. VDDA can be as high as the maximum voltage allowed for a given process before transistor damage occurs. In conventional level shifters, the higher the VDDA compared to VDDP, the more difficult it becomes for the n-type transistors (e.g., n-type metal oxide semiconductor (NMOS)) that are controlled by VDDP domain signal to fight against p-type transistors (e.g., p-type metal oxide semiconductor (PMOS)) that are at least partly in the VDDA domain.

Advantages of the present disclosure include, but are not limited to, an unlimited operating range of the level shifter with minimal impact to speed and area. In addition, leakage current is reduced.

Figure 1:
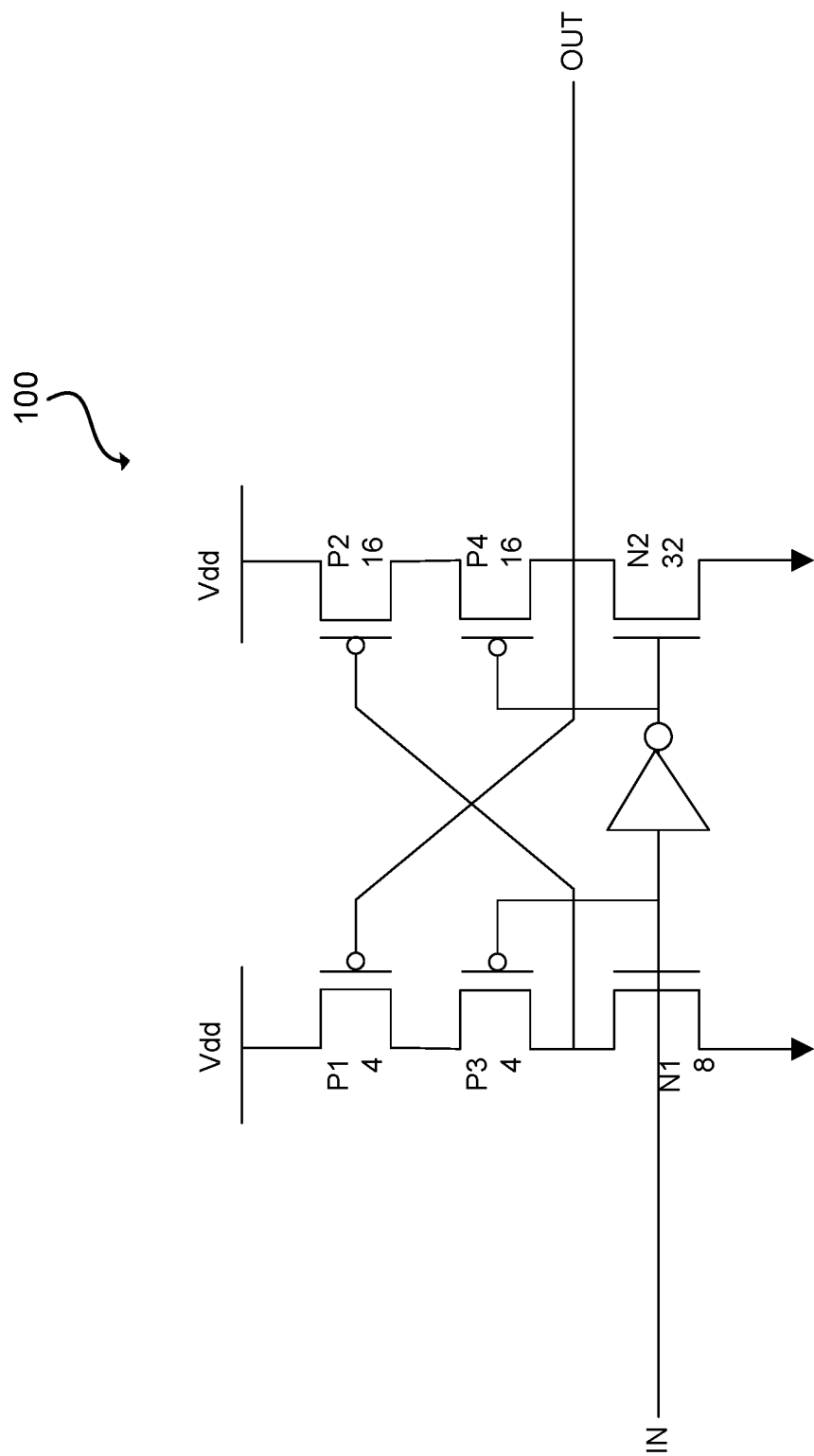
FIG. 1 illustrates a circuit diagram for a level shifter, according to aspects of the disclosure.

FIG. 1 illustrates a circuit diagram for a level shifter, according to aspects of the disclosure. Level shifter 100 includes transistors P1, P2, P3, P4, N1, and N2. Transistors P1, P2, P3, and P4 can be p-transistors (i.e., PMOS). Transistors N1 and N2 can be n-transistors (e.g., NMOS). Transistors P1, P2, P3, P4, N1, and N2 may be low voltage transistors (LVT). The P/N ratio is equal to 1/4. When an input signal changes from a low value to a high value, both transistor N1 and transistor P1 are on. Transistor N1 has to fight with transistor P1 to pull down a node OUT.

In some aspects, level shifter 100 may have a maximum VDDA-VDDP range at SFE (slow NMOS, fast PMOS Extreme) −40 C equal to 0.93 V/0.45 V (VDDA/VDDP) with VDDP fixed at 0.45 V. The maximum VDDA-VDDP range at SFE −40 C is equal to 0.85 V/0.43 V (VDDA/VDDP) with VDDA fixed at 0.85 V. The minimum VDDA leakage current is 320 nA for Iddq testing at 0.825 V/0.825 V.

Figure 2:
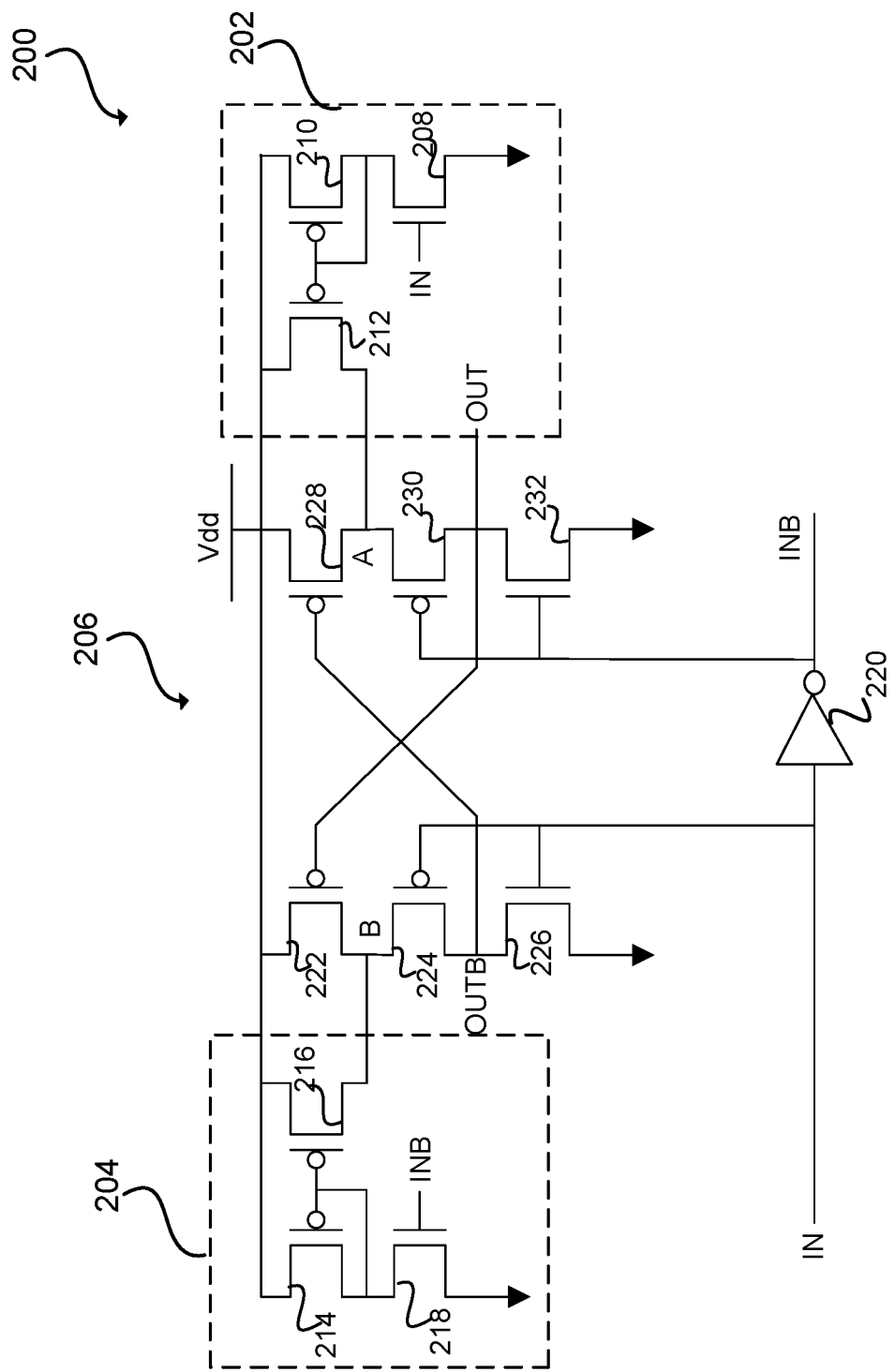
FIG. 2 illustrates a level shifter that includes current mirror branches, in accordance with an embodiment of the present disclosure.

FIG. 2 shows a level shifter in accordance with an embodiment of the present disclosure. Level shifter 200 includes a first current mirror branch 202, a second current mirror branch 204, and a level shifter section 206. By adding first current mirror branch 202 and second current mirror branch 204, level shifter 200 can guarantee operation to much lower VDDP and much higher VDDA-VDDP delta as compared to conventional level shifters.

In some embodiments, first current mirror branch (or section) 202 and second current mirror branch 204 control a voltage at a node A and at a node B, respectively. In some aspects, first current mirror branch 202 or second current mirror branch 204 may guarantee a high voltage at node A or node B. First current mirror branch 202 or second current mirror branch 204 can provide an alternate path to raise the voltage at node A or at node B compared to conventional level shifters. For example, when the voltage at node B is guaranteed to be high due to second current mirror branch 204, then the voltage at node OUTB is high. Thus, when a signal at a node INB (corresponding to the inverse of an input signal) goes high and a transistor 232 (n-type) is on, there is no fighting between the transistors as a transistor 228 (p-type) is fully off.

In some embodiments, first current mirror branch 202 may include a transistor 208, a transistor 210, and a transistor 212. In some aspects, transistor 210 and transistor 212 may be p-transistors. Transistor 208 may be a n-transistor. The gate of transistors 210 and 212 are coupled to the drain of transistor 208. Transistor 208 is gated by the input signal (coupled to input node IN). The source of transistors 210 and 212 are coupled to the power supply Vdd (i.e., voltage supply). Transistor 212 is coupled to the level shifter section 206 at node A.

In some embodiments, second current mirror branch 204 may include a transistor 214, a transistor 216, and a transistor 218. In some aspects, transistor 214 and transistor 216 may be p-transistors (i.e., p-type transistor, PMOS). Transistor 218 may be a n-transistor (i.e., n-type transistor, NMOS). The gate of transistors 214 and 216 are coupled to the drain of transistor 218. Transistor 218 is gated by an inverse of the input signal (coupled to input node INB). The signal at node INB is provided by inverting the input signal using an inverter 220. The source of transistors 214 and 216 are coupled to the power supply. Transistor 216 is coupled to the level shifter section 206 at node B.

In some embodiments, level shifter section 206 includes a transistor 222, a transistor 224, a transistor 226, transistor 228, a transistor 230, and transistor 232. Transistors 222, 224, 228, 230 may be p-transistors. Transistors 226 and 232 may be n-transistors. Transistor 222, transistor 224, and transistor 226 are coupled in series between the power supply and ground. Transistor 228, transistor 230, and transistor 226 are coupled in series between the power supply and ground.

Transistor 222 is coupled between the power supply and transistor 224 and has a gate terminal coupled to a node OUT. Transistor 224 is coupled between transistor 222 and transistor 226, and is gated by the input signal (coupled to node IN). Transistor 226 is coupled between node OUTB and ground and is gated by the input signal. Transistor 228 is coupled between the power supply and transistor 230 and has a gate terminal coupled to node OUTB. Transistor 230 is coupled between transistor 228 and transistor 232 and is gated by the inverse of the input signal (coupled to node INB). Transistor 232 is coupled between transistor 230 and ground and is gated by the inverse of the input signal (coupled to node INB).

Node A and node B have a known voltage that can be equal to power supply Vdd. Node OUTB or OUT can reach the full output voltage Vdd. Thus, one of the transistors 222 and 228 (p-type transistors) is shut off and the corresponding n-type transistors 226 or 232 can "win" without fighting regardless of the size of the transistor or the operating voltage, respectively.

In standby mode, one of the two current mirrors (i.e., first current mirror branch 202, second current mirror branch 204) can have a constant current which adds to power consumption. For example, an exemplary VDDA leakage current is equal to 207 μA in Iddq testing at 0.825 V/0.825 V (VDDA/VDDP, 125 C).

Figure 3:
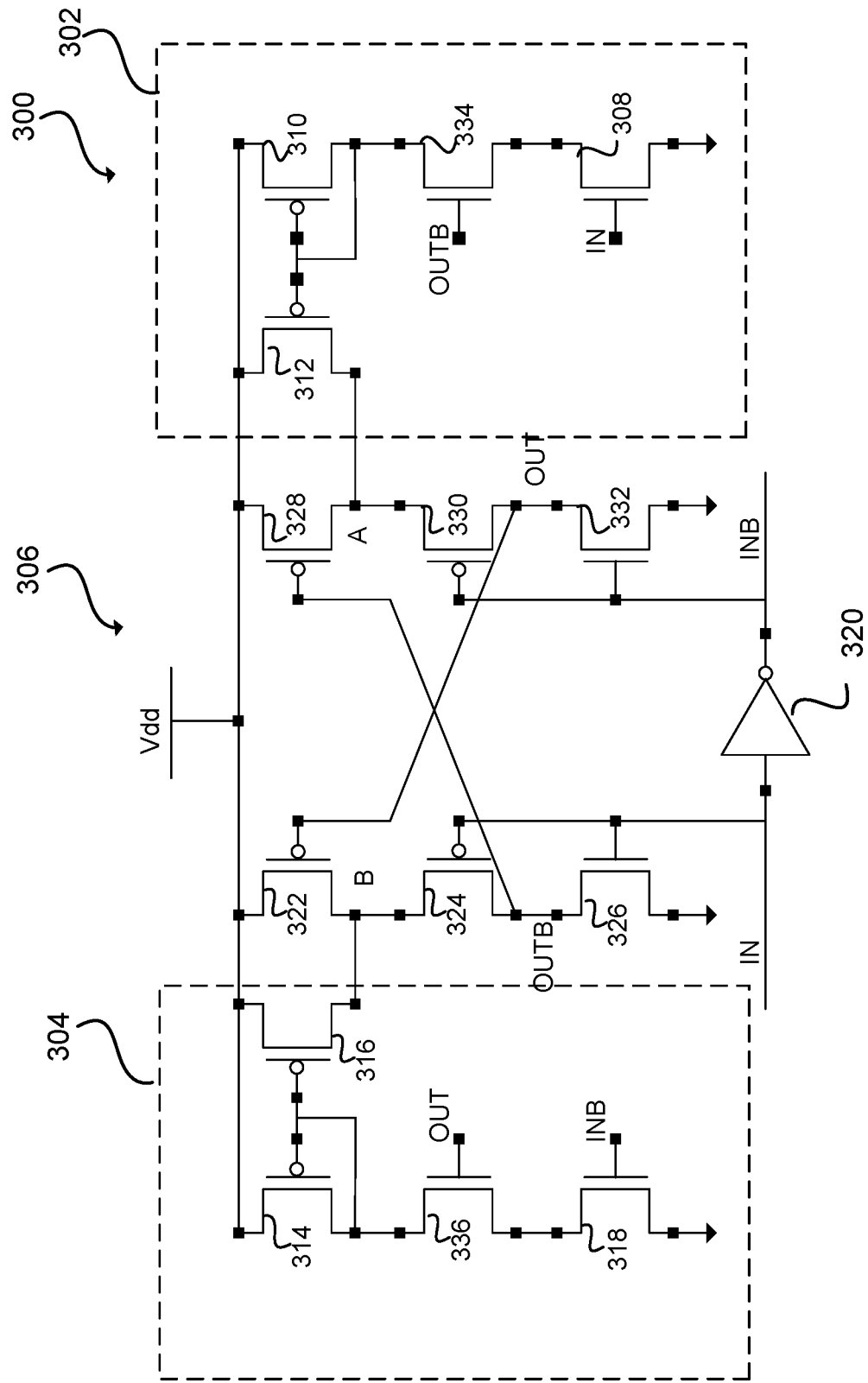
FIG. 3 illustrates a level shifter, in accordance with an embodiment of the present disclosure.

FIG. 3 illustrates a level shifter 300, in accordance with an embodiment of the present disclosure. The configuration in FIG. 3 reduces or eliminates the constant current of level shifter 200. Level shifter 300 includes a first current mirror branch 302, a second current mirror branch 304, and a level shifter section 306. Level shifter section 306 may include elements similar to level shifter section 206 of FIG. 2.

First current mirror section 302 includes p-transistors 312, 310 and n-transistors 308, 334. Transistor 310 is coupled between a power supply (Vdd) and transistor 334. Transistor 334 is coupled between transistor 310 and transistor 308, and has a gate terminal coupled to a node OUTB. Transistor 308 is gated by an input signal (coupled to a node IN) and is coupled between the transistor 334 and ground. Transistor 312 is coupled between the power supply and a node A.

Second current mirror branch 304 includes p-transistors 314, 316 and n-transistors 318, 336. Transistor 318 is gated by an inverse of the input signal (i.e., is coupled to node INB). The inverse of the input signal is provided by inverting the input signal using an inverter 320. Transistor 318 is coupled between transistor 336 and ground. Transistor 314 is coupled between the power supply and transistor 336. Transistor 316 is coupled between the power supply and a node B. Transistor 336 is coupled between transistor 314 and transistor 318, and has a gate terminal coupled to a node OUT.

In some embodiments, first current mirror branch 302 and second current mirror branch 304 may be self-timed. Thus, once the flipping is done, the current mirror is not needed to pull one of node A or node B to a high voltage. For example, once node A and node OUT are low then the function of first current mirror branch 302 is no longer used. One of transistor 336 or transistor 334 (controlled by the voltage at OUT and OUTB, respectively) turns off, once the flipping is done. Thus, the current from the current mirror branch is provided when the output signal is flipping (i.e., when the input signal and the output signal do not match).

In some embodiments, level shifter section 306 includes a transistor 322, a transistor 324, a transistor 326, a transistor 328, a transistor 330, and a transistor 332. Transistors 322, 324, 328, 330 may be p-transistors. Transistors 326 and 332 may be n-transistors. Transistor 322, transistor 324, and transistor 326 are coupled in series between the power supply and ground. Transistor 328, transistor 330, and transistor 332 are coupled in series between the power supply and ground.

Transistor 322 is coupled between the power supply and transistor 324 and has a gate terminal coupled to node OUT. Transistor 324 is coupled between transistor 322 and transistor 326, and is gated by the input signal. Transistor 326 is coupled between node OUTB and ground and is gated by the input signal. Transistor 328 is coupled between the power supply and transistor 330 and has a gate terminal coupled to node OUTB. Transistor 330 is coupled between transistor 328 and transistor 332 and is gated by the inverse of the input signal. Transistor 332 is coupled between transistor 330 and ground. Transistor 332 is gated by the inverse of the input signal.

As described previously herein, first current mirror branch 302 or second current mirror branch 304 may inject current to a side of the level shifter section 306 (i.e., transistors 322, 324, 326 or transistors 328, 330, 332 that is in an off state. Thus, first current mirror 302 may control a voltage at a gate terminal of transistor 322 via transistor 330 and second current mirror 304 may control a voltage at a gate terminal of transistor 328 via transistor 324.

Level shifter 300 provides unlimited VDDA-VDDP delta and a low VDDP, no DC current, and less switching current at high VDDA/low VDDP compared to the conventional level shifter 100. The leakage current may be higher than in conventional level shifters if the transistors are sized for speed.

The maximum VDDA-VDDP range at SFE −40 C is greater than or equal to 1.55 V/0.45 V (VDDA/VDDP) with VDDP fixed at 0.45 V. 1.55 V is for illustration only and VDDA can be even higher for transistor that can function at 1.55 V or higher without gate oxide breakdown. The maximum VDDA-VDDP range at SFE −40 C is equal to 0.85 V/0.23 V (VDDA/VDDP) with VDDA fixed at 0.85 V. The minimum VDDP at SFE −40 C equals to 0.63 V/0.23 V (VDDA/VDDP) with VDDA-VDDP fixed at 400 mV. The minimum VDDA leakage current is 270 nA at Iddq testing at 0.825/0.825.

Figure 4:
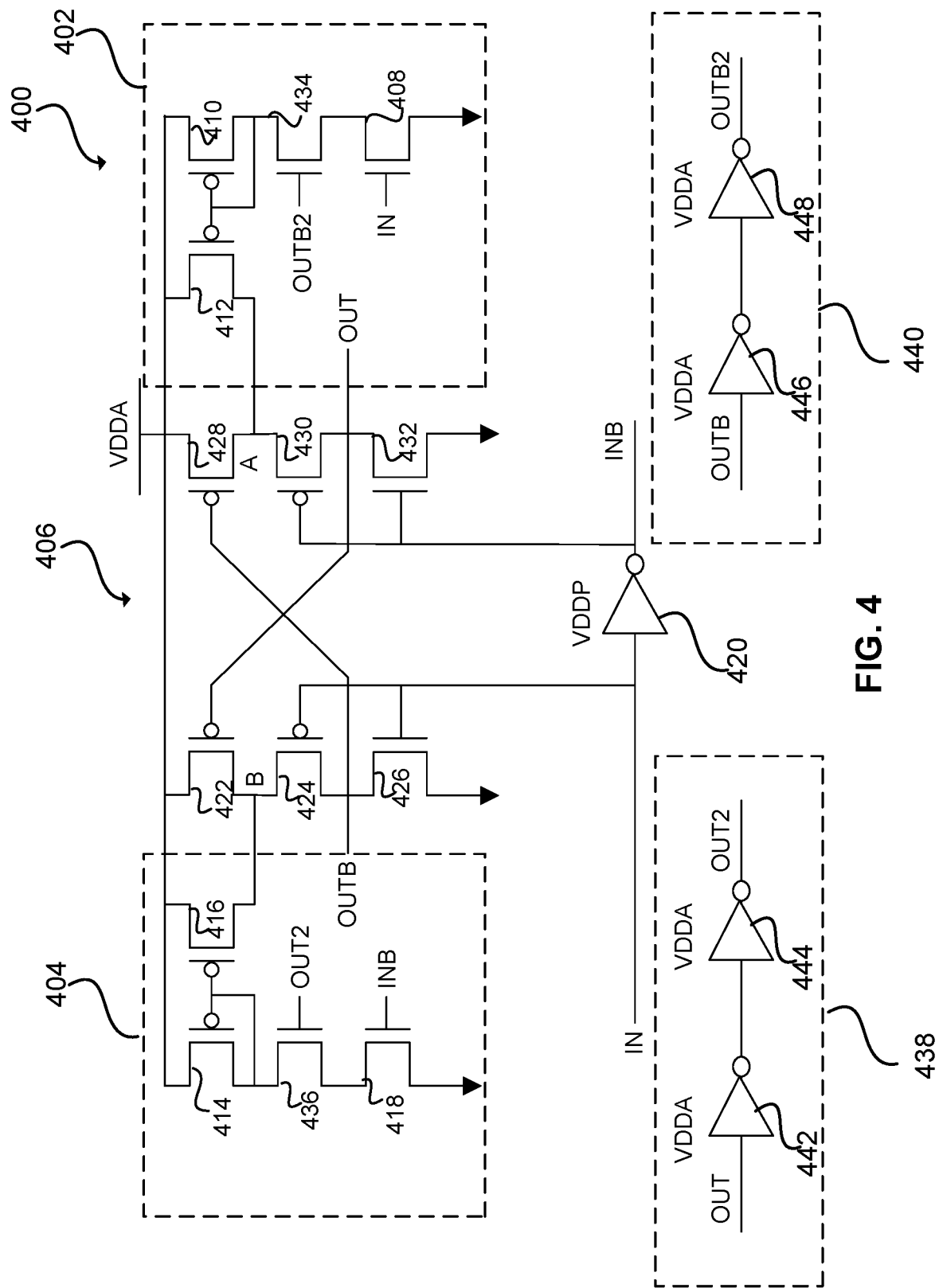
FIG. 4 illustrates an example level shifter with reduced shoot-thru current during switching, in accordance with an embodiment of the present disclosure.

FIG. 4 illustrates an example level shifter with reduced shoot-thru current during switching, in accordance with an embodiment of the present disclosure. A level shifter 400 includes a first current mirror branch 402, a second current mirror branch 404, a level shifter section 406, an inverter 420, a first shoot-thru current section 438, and a second 420, a first shoot-thru current section 440. Level shifter 400 provides more time to flip before self-timed loops of first current mirror branch 402 and second current mirror branch 404 time out. Level shifter 400 may use more power due to the additional inverters.

First shoot-thru current section 438 and second shoot-thru current section 440 provide additional delay during the switching or flipping of the output to reduce a dynamic current via reduction of shoot thru current. When the input signal is rising, there are a short period of time when fighting between transistors might happen until a voltage at a node OUT turns to high. Adding the delay decrease the shoot thru current that happen during the short period of time before reaching non-fighting status is reached.

In some embodiments, the level shifter section 406 may include elements similar to level shifter section 306 of FIG. 3. First current mirror branch 402 and second current mirror branch 404 may include elements similar to first current mirror branch 302 and second current mirror branch 304 of FIG. 3, respectively. In some aspects, level shifter section 406 includes a transistor 422, a transistor 424, a transistor 426, a transistor 428, a transistor 430, and a transistor 432.

In some embodiments, first shoot-thru current section 438 may include two inverters 442, 444. An input of the first shoot-thru current section 410 is coupled to node OUT and an output of the first shoot-thru current section 438 is coupled to a node OUT2. The terminal gate of transistor 436 is coupled to node OUT2.

In some embodiments, second shoot-thru current section 440 may include two inverters 446, 448. An input of second shoot-thru current section 440 is coupled to node OUTB and an output of second shoot-thru current section 440 is coupled to a node OUTB2. The terminal gate of transistor 434 is coupled to node OUTB2.

First current mirror section 402 includes p-transistors 412, 410 and n-transistors 408, 434. Transistor 410 is coupled between a power supply (VDDA) and transistor 434. Transistor 434 is coupled between transistor 410 and transistor 408, and has a gate terminal coupled to the node OUTB2. Transistor 408 is gated by the input signal (coupled to node IN) and is coupled between transistor 434 and ground. Transistor 412 is coupled between the power supply and node A.

Second current mirror branch 404 includes p-transistors 414, 416 and n-transistors 418, 436. Transistor 418 is gated by the inverse of the input signal (coupled to node INB). The inverse of the input signal is provided by inverting the input signal using inverter 420. Transistor 418 is coupled between transistor 436 and ground. Transistor 414 is coupled between the power supply and transistor 436. Transistor 416 is coupled between the power supply and internal node B. Transistor 436 is coupled between transistor 414 and transistor 418, and has a gate terminal coupled to node OUT2.

In some embodiments, transistors 422, 424, 428, and 430 may be p-transistors. Transistors 426 and 432 may be n-transistors. Transistor 422, transistor 424, and transistor 426 are coupled in series between the power supply and ground. Transistor 428, transistor 430, and transistor 426 are coupled in series between the power supply and ground.

Transistor 422 is coupled between the power supply and transistor 424 and has a gate terminal coupled to node OUT.

Transistor 424 is coupled between transistor 422 and transistor 426, and is gated by the input signal. Transistor 426 is coupled between node OUTB and ground and is gated by input signal IN. Transistor 428 is coupled between the power supply and transistor 430 and has a gate terminal coupled to node OUTB. Transistor 430 is coupled between transistor 428 and transistor 432 and is gated by the inverse of the input signal. Transistor 432 is coupled between transistor 430 and ground and is gated by the inverse of the input signal.

Figure 5:
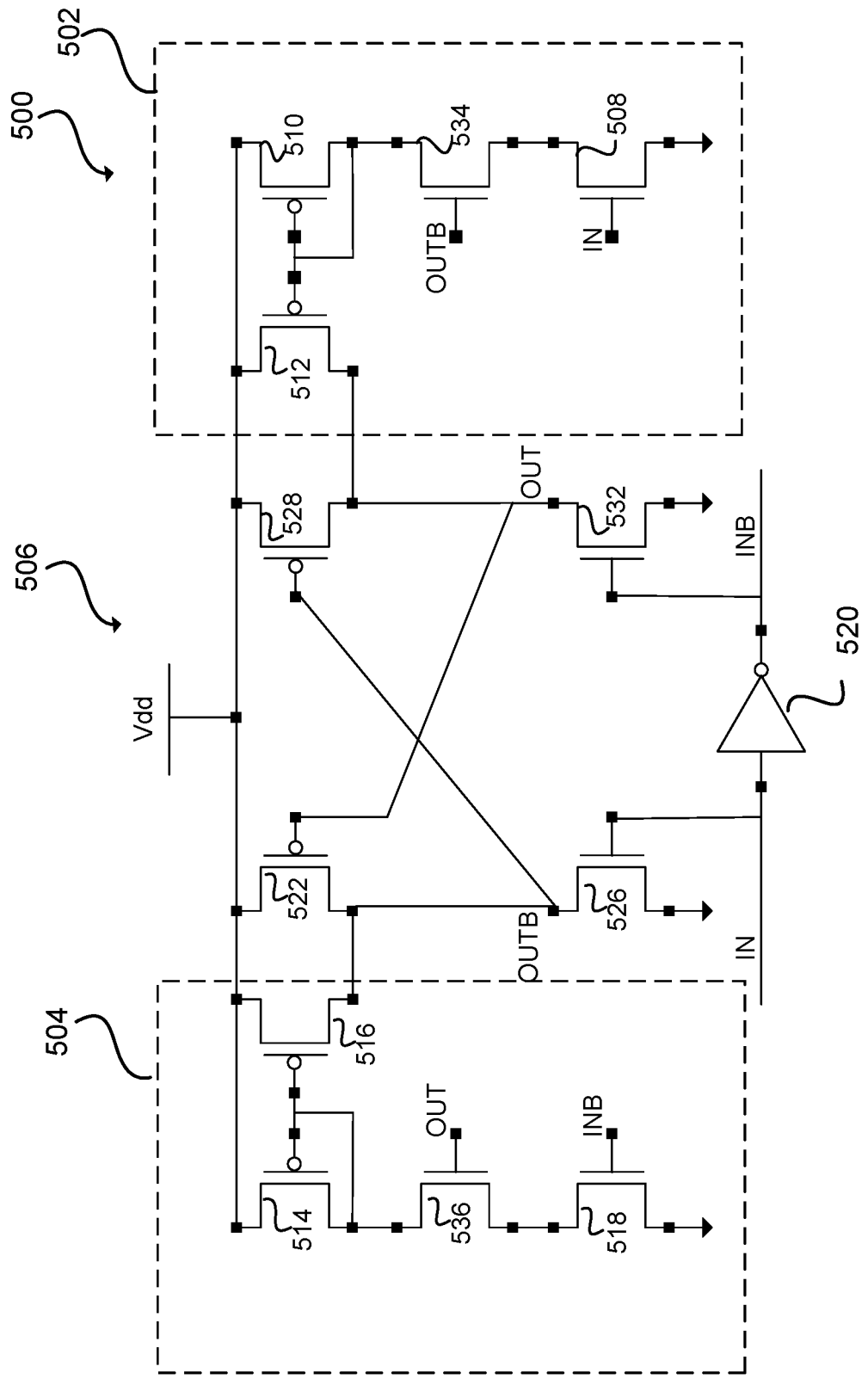
FIG. 5 illustrates an example level shifter, in accordance with an embodiment of the present disclosure.

FIG. 5 illustrates a level shifter 500, in accordance with an embodiment of the present disclosure. Level shifter 500 includes a first current mirror branch 502, a second current mirror branch 504, and a level shifter section 506.

In some embodiments, level shifter section 506 may be implemented to improve area and speed without impacting the range of level shifter. Additional p-transistors in the level shifter section 506 may not be needed to provide additional feedback because first current mirror branch 502 and second current mirror branch 504 limit the fighting between the n and p transistors. In addition, the size of the remaining p-transistors may be reduced (e.g., by half) to maintain an equivalent pull-up strength. The speed is improved by 35% (e.g., from 105 ps for level shifter 300 of FIG. 3 to 68 ps for level shifter 500).

First current mirror branch 502 and second current mirror branch 504 may include elements similar to first current mirror branch 302 and second current mirror branch 304 of FIG. 3.

First current mirror section 502 includes p-transistors 512, 510 and n-transistors 508, 534. Transistor 510 is coupled between a power supply (Vdd) and transistor 534. Transistor 534 is coupled between transistor 510 and transistor 508, and has a gate terminal coupled to the node OUTB. Transistor 508 is gated by an input signal (coupled to a node IN) and is coupled between transistor 534 and ground. Transistor 512 is coupled between the power supply and a node OUT.

Second current mirror branch 504 includes p-transistors 514, 516 and n-transistors 518, 536. Transistor 518 is gated by the inverse of the input signal (coupled to node INB). The inverse of the input signal is provided by inverting the input signal using an inverter 520. Transistor 518 is coupled between transistor 536 and ground. Transistor 514 is coupled between the power supply and transistor 536. Transistor 516 is coupled between the power supply and node OUTB. Transistor 536 is coupled between transistor 514 and transistor 518, and has a gate terminal coupled to node OUT.

In some embodiments, level shifter section 506 includes a transistor 522, a transistor 526, a transistor 528, and a transistor 532. Transistors 522, 528 may be p-transistors. Transistors 526 and 532 may be n-transistors. Transistor 522 and transistor 526 are coupled in series between the power supply and ground. Transistor 528 and transistor 532 are coupled in series between the power supply and ground.

Transistor 522 is coupled between the power supply and transistor 526 and has a gate terminal coupled to node OUT. Transistor 526 is coupled between transistor 522 and ground, and is gated by the input signal. Transistor 528 is coupled between the power supply and transistor 532 and has a gate terminal coupled to node OUTB. Transistor 532 is coupled between transistor 528 and ground and is gated by the inverse of the input signal.

Figure 6:
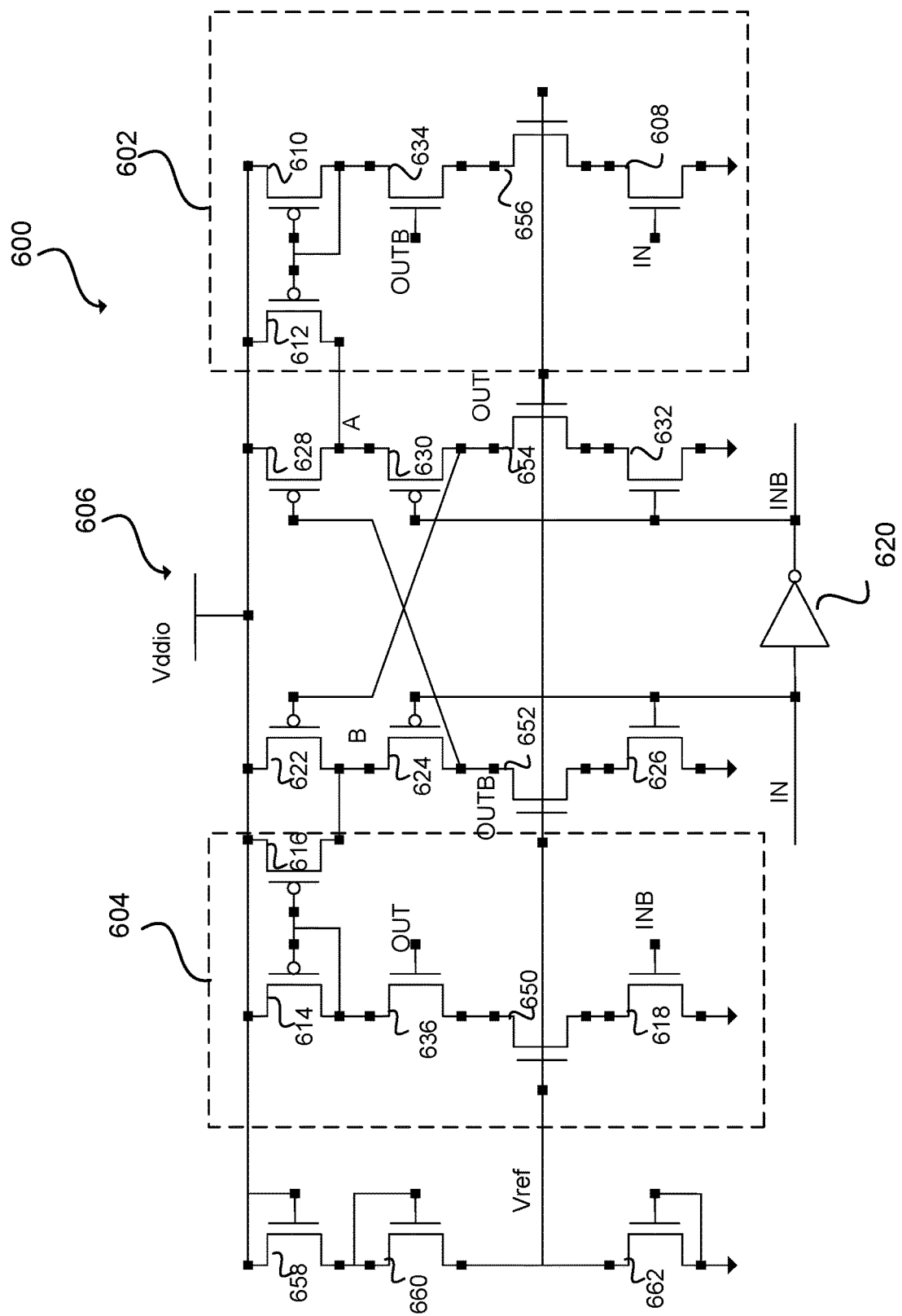
FIG. 6 illustrates an example level shifter for an input output (10) pad, in accordance with an embodiment of the present disclosure.

FIG. 6 illustrates an example level shifter for an IO pad in accordance with an embodiment of the present disclosure. A level shifter 600 includes a first current mirror branch 602, a second current mirror branch 604, a level shifter section 606, and an inverter 620. Level shifter 600 may be used between a low voltage domain (e.g., 1 V) and a high voltage domain (e.g., 1.8 V). Additional transistors 650, 652, 654, and 656 may be used to limit the voltage at the drain of low voltage domain transistors. In FIG. 6, transistors 618, 626, 632, 608 and inverter 620 are low voltage devices/transistors (i.e., thin oxide).

First current mirror section 602 includes p-transistors 612, 610 and n-transistors 608, 634, 656. Transistor 610 is coupled between a power supply (Vddio) (e.g., 1.8 V) and transistor 634. Transistor 634 is coupled between transistor 610 and transistor 656, and has a gate terminal coupled to node OUTB. Transistor 608 is gated by an input signal (coupled to a node IN) and is coupled between the transistor 656 and ground. Transistor 612 is coupled between the power supply and a node A. Transistor 656 is coupled between transistor 634 and transistor 608 and has a gate terminal coupled to a node Vref.

Second current mirror branch 604 includes p-transistors 614, 616 and n-transistors 618, 636, 650. Transistor 618 is gated by an inverse of the input signal (i.e., is coupled to node INB). The inverse of the input signal is provided by inverting the input signal using inverter 620. Transistor 618 is coupled between transistor 650 and ground. Transistor 614 is coupled between the power supply and transistor 636. Transistor 616 is coupled between the power supply and a node B. Transistor 636 is coupled between transistor 614 and transistor 650, and has a gate terminal coupled to node OUT. Transistor 650 is coupled between transistor 636 and transistor 618 and has a gate terminal coupled to node Vref.

In some embodiments, level shifter section 606 includes a transistor 622, a transistor 624, transistor 626, a transistor 628, a transistor 630, transistor 632, a transistor 652, and a transistor 654. Transistors 622, 624, 628, 630 may be p-transistors. Transistors 626, 652, 654, and 632 may be n-transistors. Transistor 622, transistor 624, transistor 652, and transistor 626 are coupled in series between the power supply and ground. Transistor 628, transistor 630, transistor 654, and transistor 632 are coupled in series between the power supply and ground.

Transistor 622 is coupled between the power supply and transistor 624 and has a gate terminal coupled to node OUT. Transistor 624 is coupled between transistor 622 and transistor 652, and is gated by the input signal. Transistor 626 is coupled between transistor 652 and ground and is gated by the input signal. Transistor 628 is coupled between the power supply and transistor 630 and has a gate terminal coupled to a node OUTB. Transistor 630 is coupled between transistor 628 and transistor 654 and is gated by the inverse of the input signal. Transistor 632 is coupled between transistor 654 and ground. Transistor 632 is gated by the inverse of the input signal. A respective gate terminal of transistors 652 and 654 are coupled to node Vref.

Figure 7A:
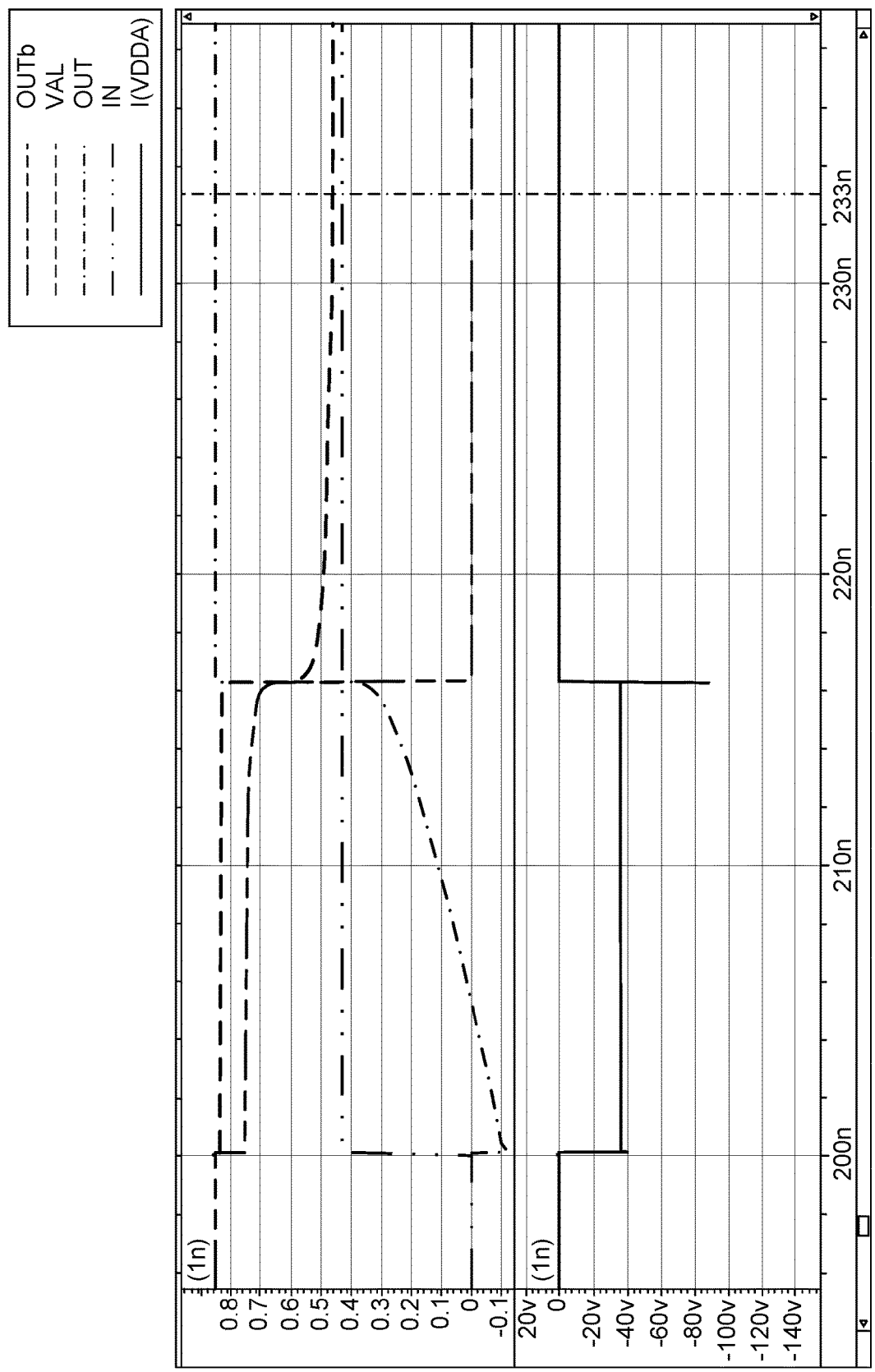
FIGS. 7A-7I illustrate waveforms of example level shifters, in accordance with an embodiment of the present disclosure.
Figure 7B:
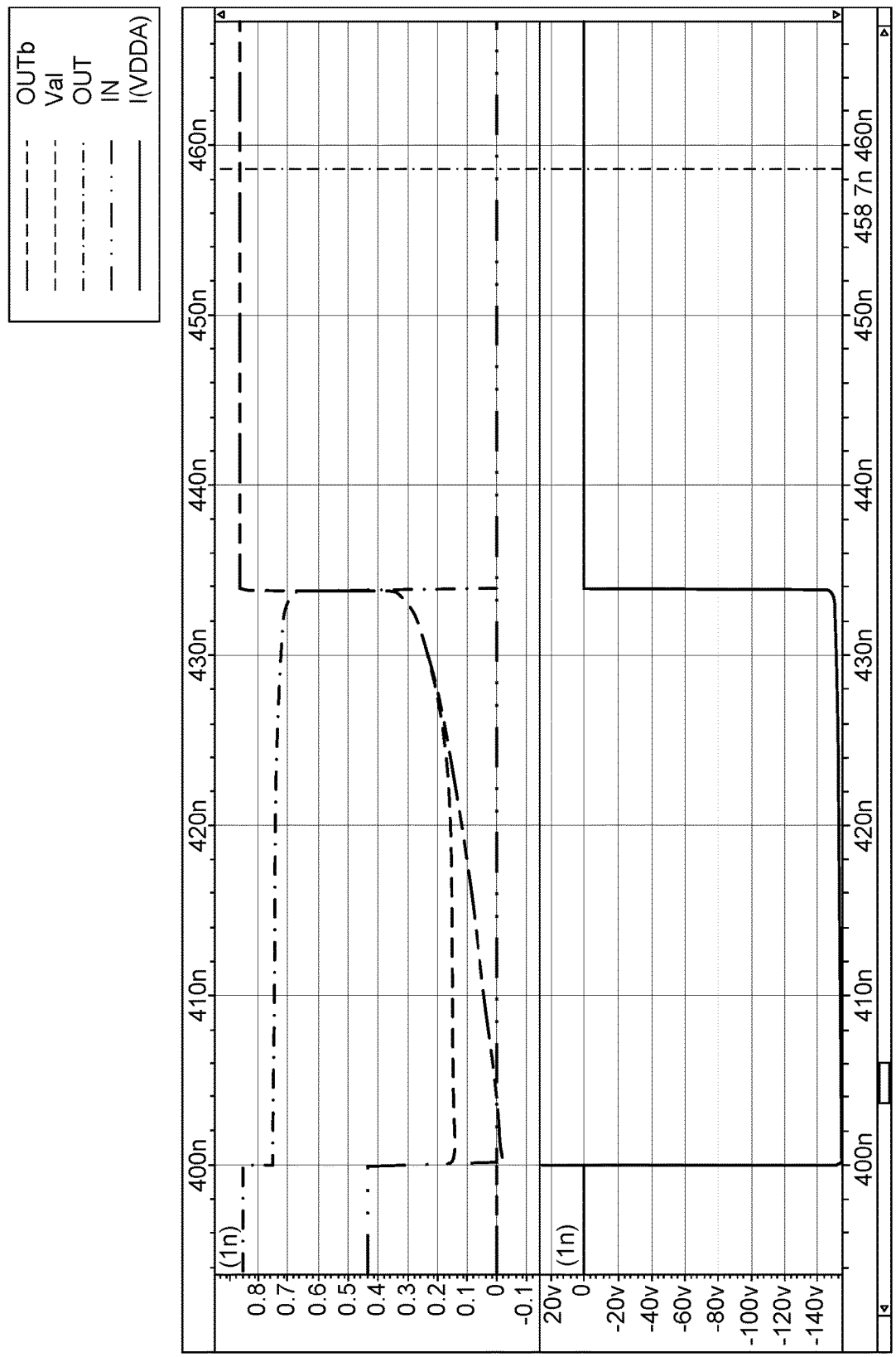
Figure 7C:
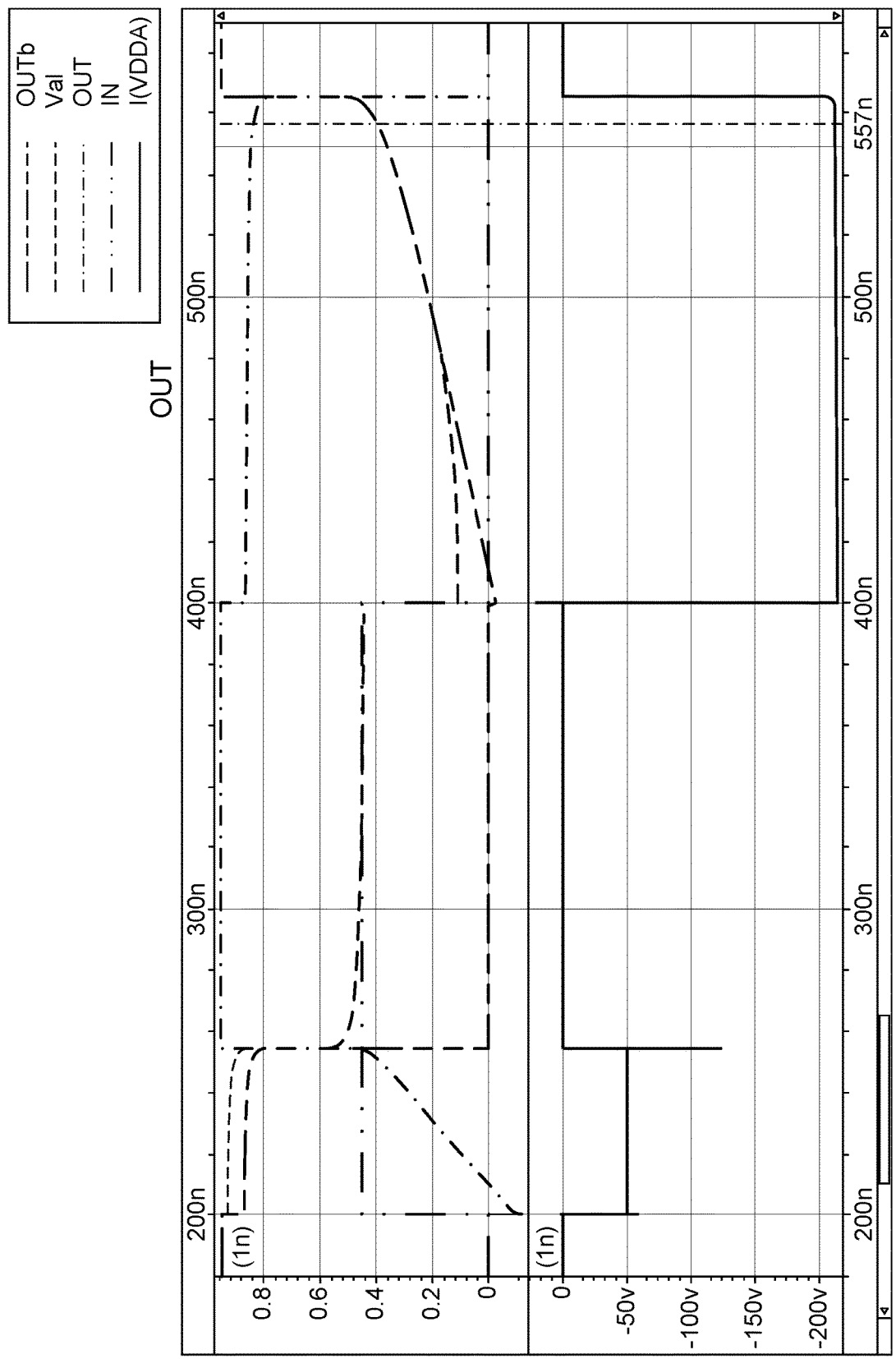

FIG. 7A shows the waveforms for conventional level shifter 100 for an input rising edge, SFE −40 C, 0.85 V/0.43 V VDDA/VDDP. FIG. 7B shows the waveforms for the conventional level shifter 100 for an input falling edge, SFE −40 C, 0.85 V/0.43 V VDDA/VDDP. FIG. 7C shows the waveforms for conventional level shifter 100 for an input falling edge, SFE −40 C, 0.95 V/0.45 V VDDA/VDDP. VAL corresponds to the voltage at node A of FIG. 1.

Figure 7D:
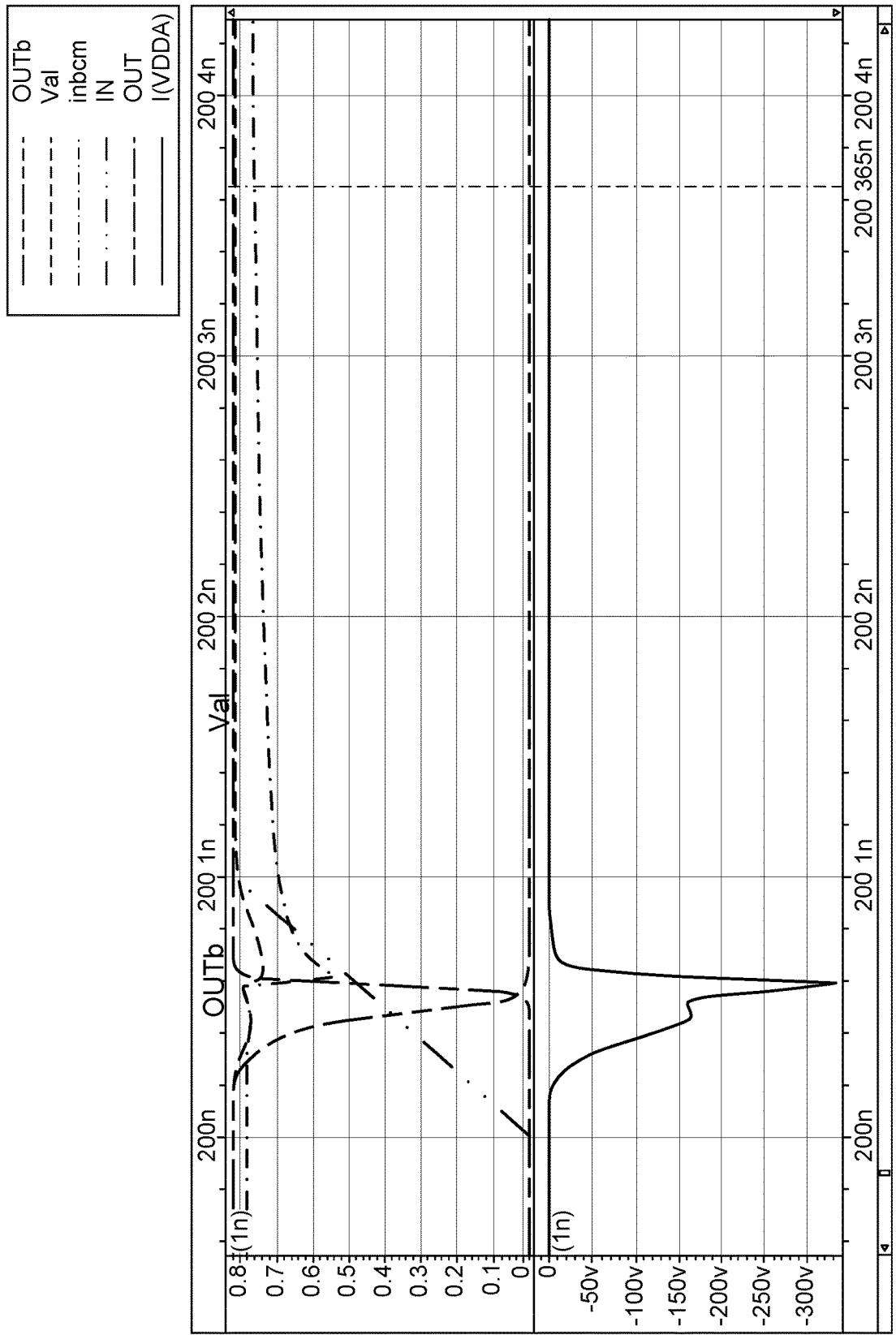
Figure 7E:
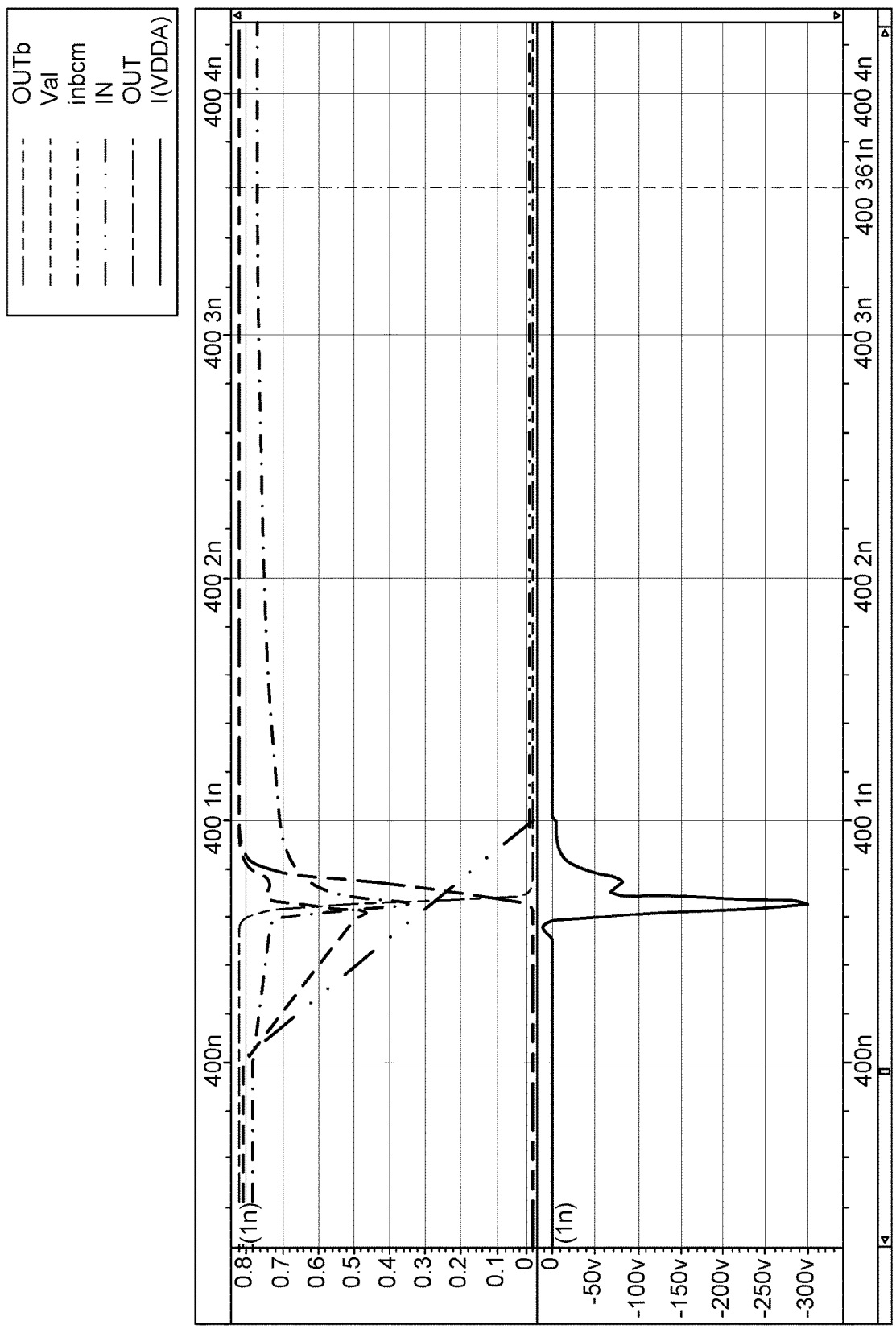

FIG. 7D shows the waveforms for the level shifter 300 for an input rising edge, for Iddq testing at 125 C, 0.825 V/0.825 V VDDA/VDDP. FIG. 6E shows the waveforms for the level shifter 300 for an input falling edge (labeled FF_IDDQ), 125 C, 0.825 V/0.825 V VDDA/VDDP.

Figure 7F:
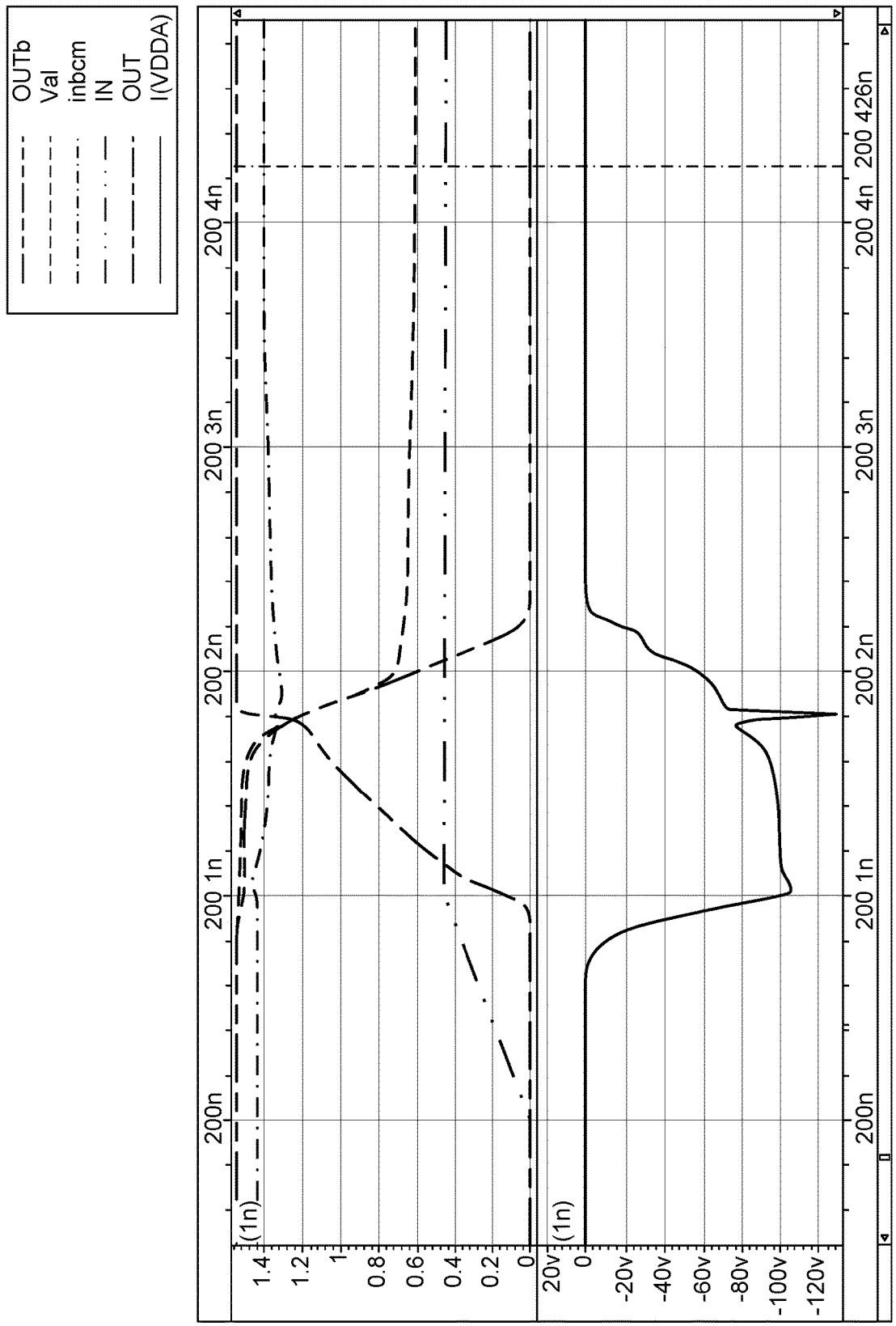

FIG. 7F shows the waveforms for the level shifter 300 for an input rising edge, SFE, −40 C, 1.55 V/0.45 V VDDA/

Figure 7G:
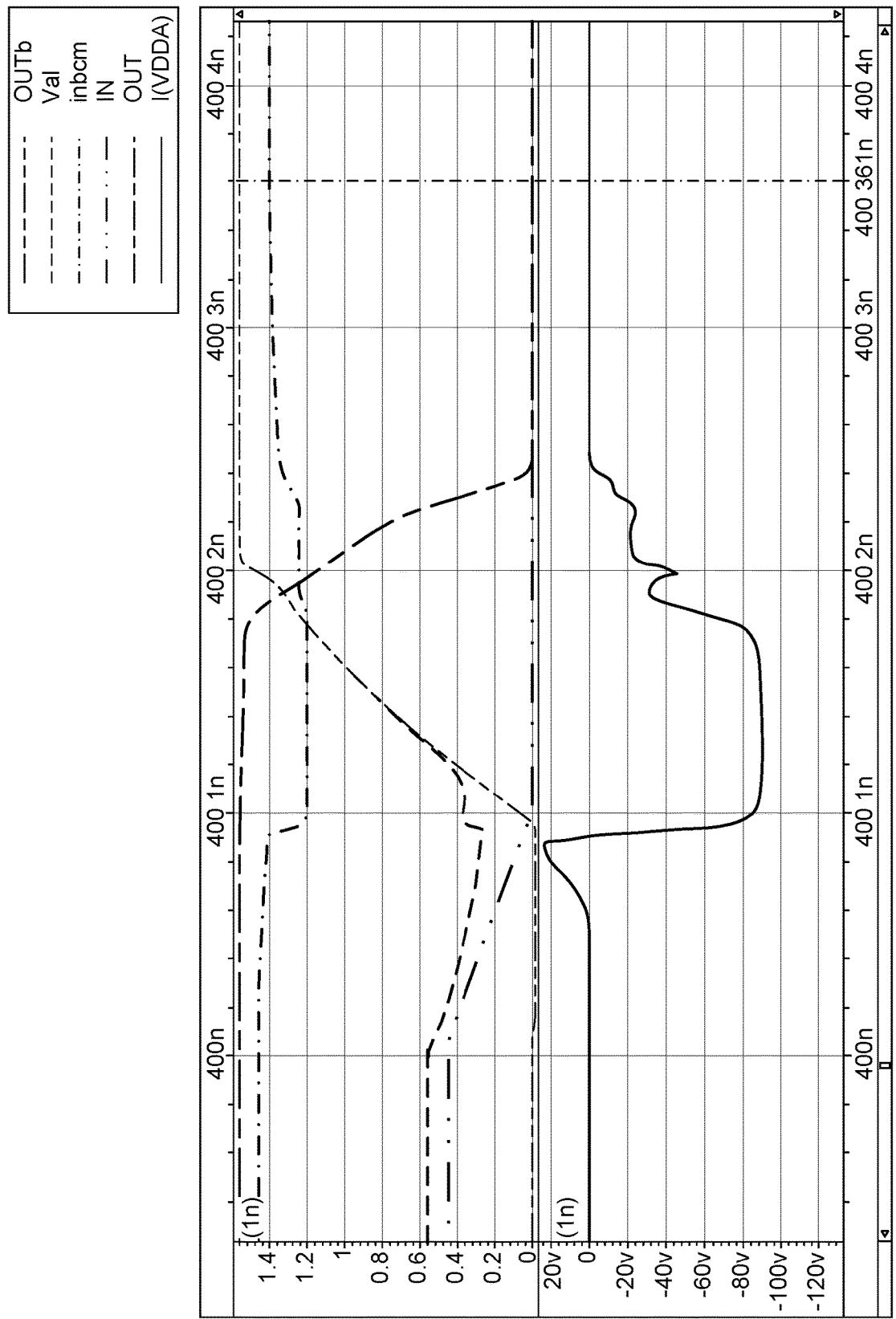
Figure 7H:
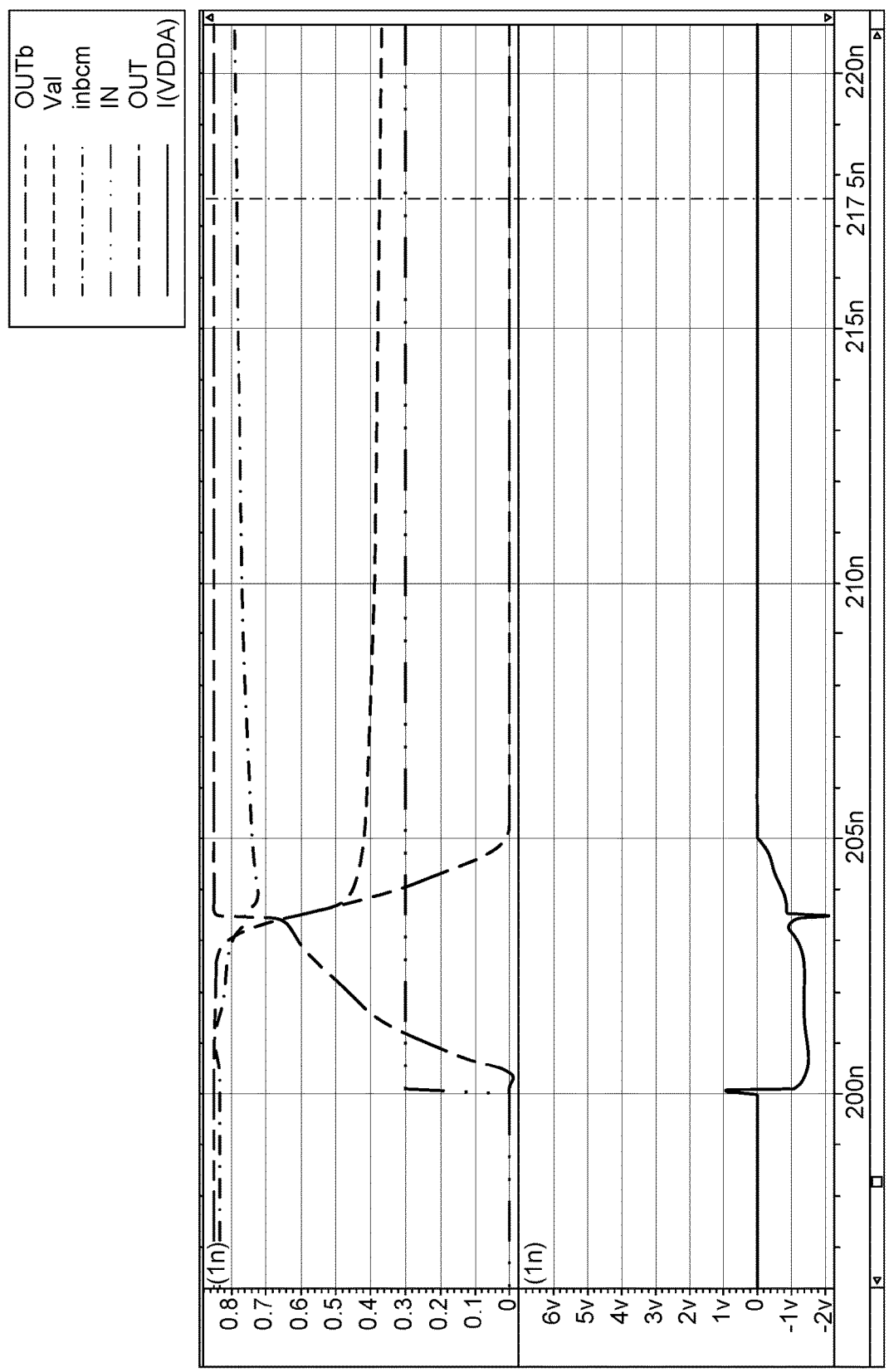
Figure 7I:
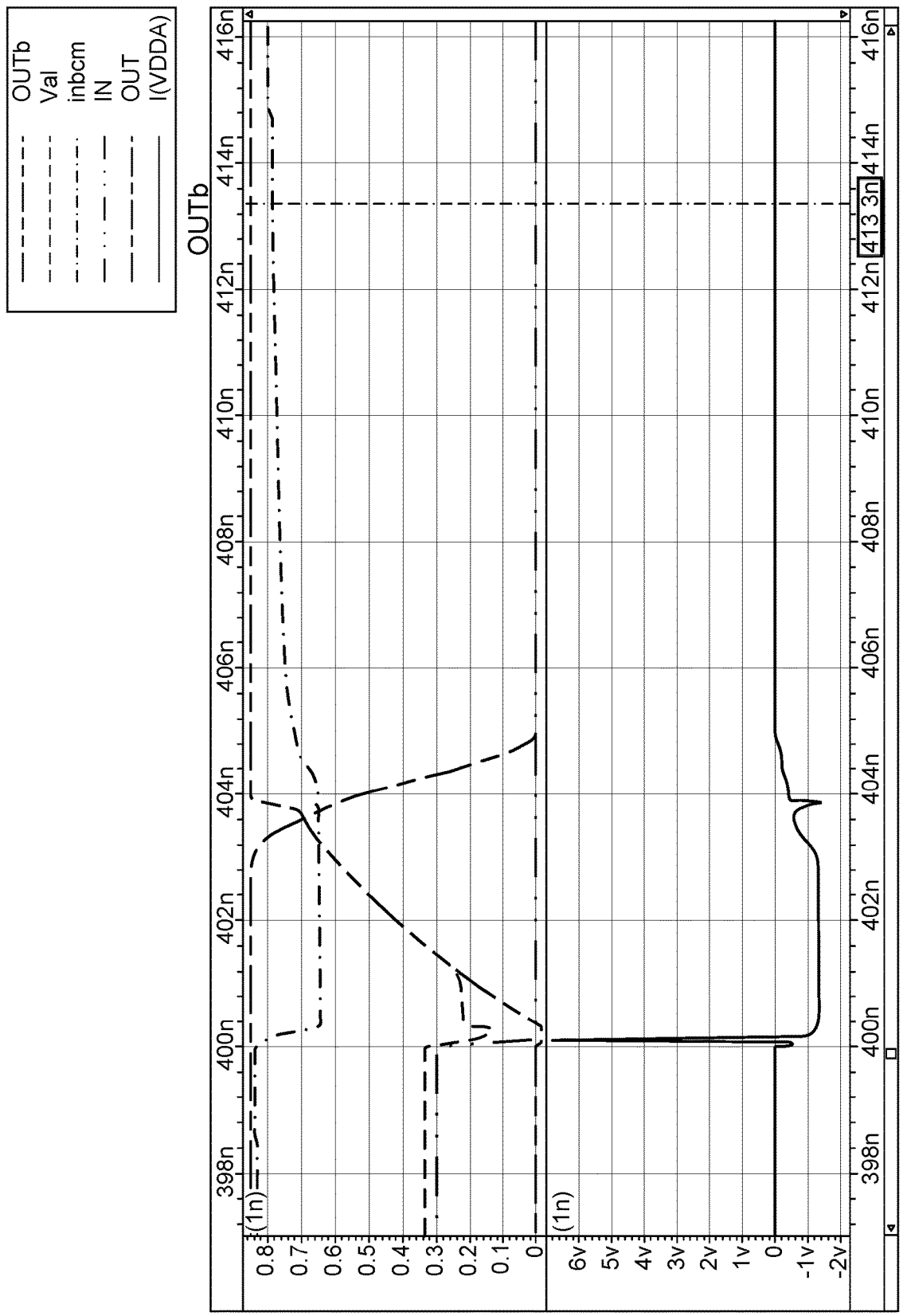

VDDP. FIG. 7G shows the waveforms for the level shifter 300 for an input falling edge, SFE −40 C, 1.55 V/0.45 V VDDA/VDDP. FIG. 7H shows the waveforms for the level shifter 300 for an input rising edge, SFE −40 C, 0.85 V/0.3 V VDDA/VDDP. FIG. 7I shows the waveforms for the level shifter 300 for an input falling edge, SFE −40 C, 0.85 V/0.3 V VDDA/VDDP. VAL corresponds to the voltage at node A of FIG. 3. Inbcm corresponds to the voltage at the drain of transistor 314.

Figure 8:
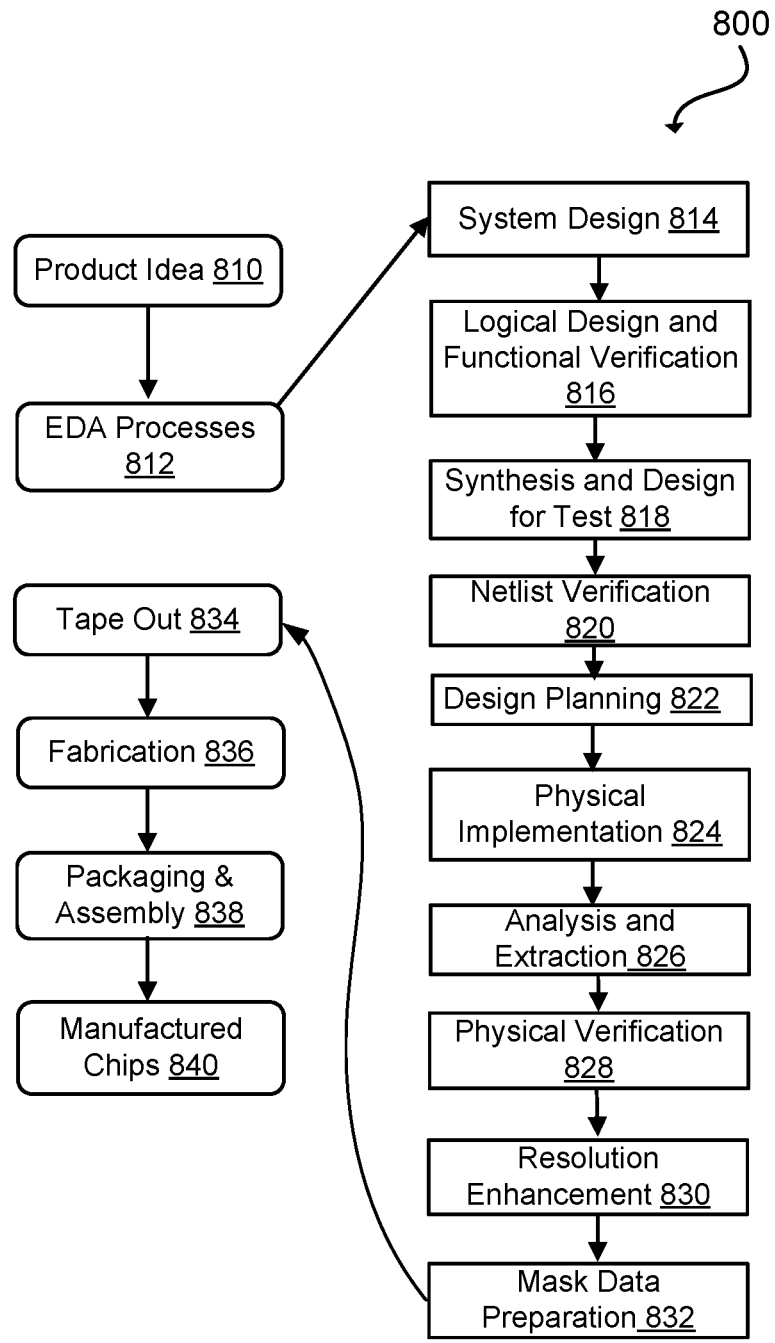
FIG. 8 depicts a flowchart of various processes used during the design and manufacture of an integrated circuit in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 8. The processes described can be enabled by EDA products (or tools).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 9:
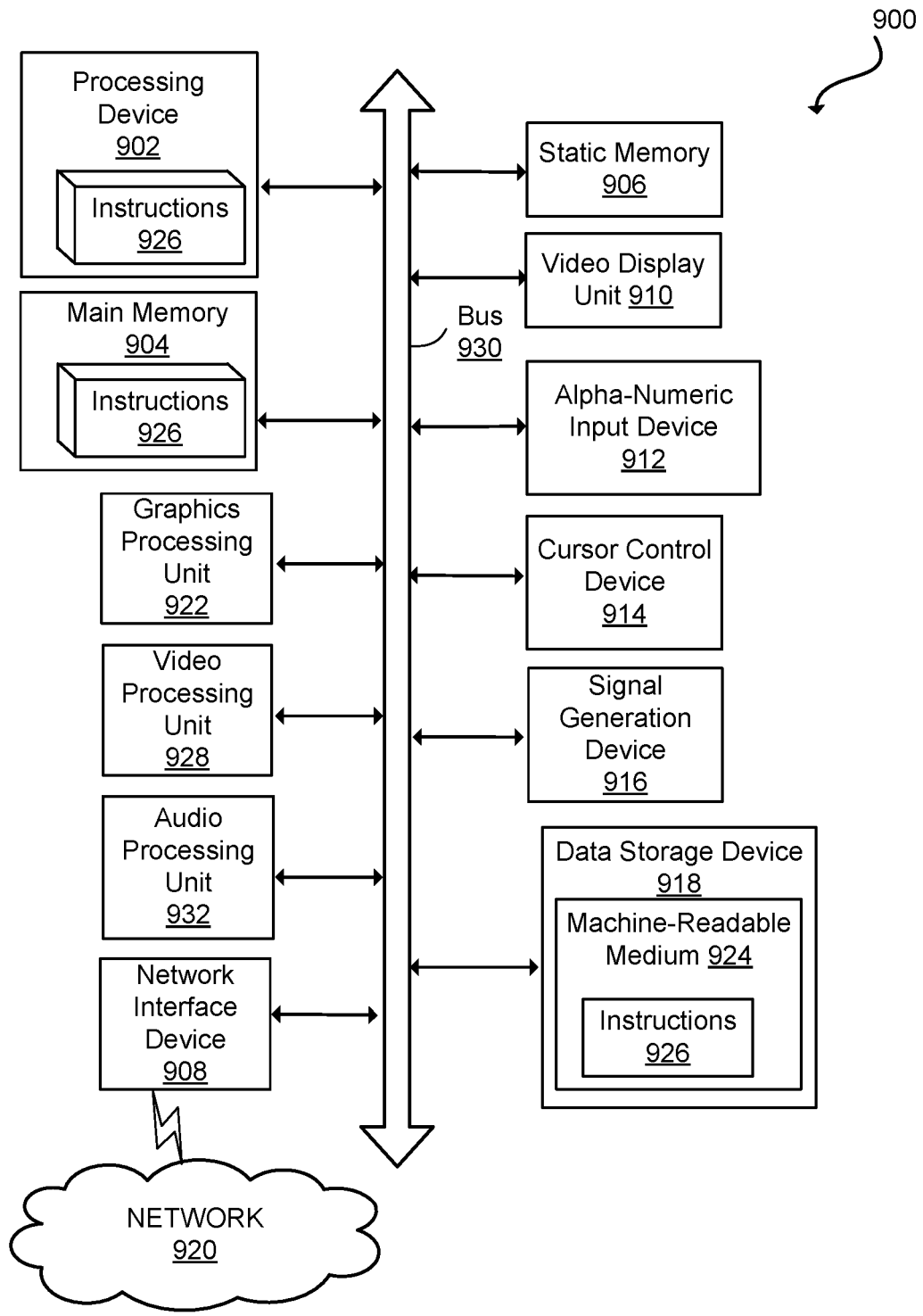
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A level shifter circuit, comprising:
   a first current mirror coupled between a power terminal and a ground terminal, wherein the first current mirror comprises a first n-type transistor gated by an input signal, and wherein the first current mirror is self-timed;
   a second current mirror coupled between the power terminal and the ground terminal, wherein the second current mirror comprises a second n-type transistor gated by an inverse of the input signal, and wherein the second current mirror is self-timed;
   a level shifter, wherein the level shifter includes a first transistor coupled to the first current mirror and a second transistor coupled to the second current mirror, wherein the first current mirror and the second current mirror control a state of the first transistor and the second transistor;
   a first shoot-thru current section comprising a first inverter and a second inverter directly coupled between a gate of the first transistor and the first current mirror; and
   a second shoot-thru current section comprising a third inverter and a fourth inverter directly coupled between a gate of the second transistor and the second current mirror.

2. The level shifter circuit of claim 1, wherein the first current mirror controls a voltage at a gate of the second transistor; and
   wherein the second current mirror controls the voltage at the gate of the first transistor.

3. The level shifter circuit of claim 1, wherein the first current mirror comprises:
   a third transistor coupled between the power terminal and a fourth transistor,
   the fourth transistor coupled between the third transistor and the ground terminal, and
   a fifth transistor coupled between the power terminal and a drain terminal of the first transistor;
   wherein the second current mirror comprises:
   a sixth transistor coupled between the power terminal and a seventh transistor,
   the seventh transistor coupled between the sixth transistor and the ground terminal, and
   an eighth transistor coupled between the power terminal and a drain terminal of the second transistor; and
   wherein
   a gate terminal of the third transistor is coupled to a drain terminal of the third transistor and to a gate terminal of the fifth transistor and a gate terminal of the sixth transistor is coupled to a drain terminal of the sixth transistor and to a gate terminal of the eighth transistor.

4. The level shifter circuit of claim 3, wherein the first current mirror further comprises a ninth transistor coupled between the fourth transistor and the first n-type transistor; and the second current mirror further comprises a tenth transistor coupled between the seventh transistor and the second n-type transistor.

5. The level shifter circuit of claim 3, wherein the third transistor, the fifth transistor, the sixth transistor, and the eighth transistor are p-type transistors, and the fourth transistor and the seventh transistor are n-type transistors.

6. The level shifter circuit of claim 1, wherein the first shoot-thru current section and the second shoot-thru current section are configured to control a timing of the first current mirror and the second current mirror in the level shifter circuit.

7. The level shifter circuit of claim 1, wherein
   each of the inverters is configured to introduce a delay in the level shifter circuit.

8. The level shifter circuit of claim 1, wherein the level shifter further comprises:
   a third transistor coupled between the first transistor and ground and a fourth transistor coupled between the second transistor and ground, wherein the fourth transistor is gated by an input signal.

9. The level shifter circuit of claim 8, wherein the level shifter further comprises:
   a fifth transistor coupled between the first transistor and the third transistor and a sixth transistor coupled between the second transistor and the fourth transistor, wherein the first current mirror is coupled to a drain terminal of the first transistor and the second current mirror is coupled to a drain terminal of the second transistor; and
   wherein the first current mirror is configured to control a voltage at a gate terminal of the second transistor via the fifth transistor and the second current mirror is configured to control a voltage at a gate terminal of the first transistor via the sixth transistor.

10. The level shifter circuit of claim 1, wherein one or more transistors of the level shifter, the first current mirror, and the second current mirror are low voltage transistors and the level shifter circuit further comprising:
    at least one transistor coupled to a drain of a low voltage transistor and configured to control a voltage at the drain of the low voltage transistor.

11. The level shifter circuit of claim 1, wherein an input terminal of the level shifter is coupled to an input/output circuit.

12. A level shifter circuit, comprising:
    a first current mirror coupled between a power terminal and a ground terminal, wherein the first current mirror comprises a first n-type transistor gated by an input signal, and wherein the first current mirror is self-timed;
    a second current mirror coupled between the power terminal and the ground terminal, wherein the second current mirror comprises a second n-type transistor gated by an inverse of the input signal, and wherein the second current mirror is self-timed;
    a level shifter including a first p-type transistor and a second p-type transistor, wherein the first current mirror and the second current mirror are configured to control a voltage at a gate of the first p-type transistor and the second p-type transistor;
    a first shoot-thru current section comprising a first inverter and a second inverter directly coupled between a gate of the first p-type transistor and the first current mirror; and a second shoot-thru current section comprising a third inverter and a fourth inverter directly coupled between a gate of the second p-type transistor and the second current mirror.

13. The level shifter circuit of claim 12, wherein the first current mirror or the second current mirror further comprise:
   a third p-type transistor coupled between the power terminal and the first n-type transistor;
   a fourth p-type transistor coupled between the power terminal and a drain of the first p-type transistor, wherein a gate of the fourth p-type transistor is coupled to the gate of the third p-type transistor;
   a fifth p-type transistor coupled between the power terminal and the second-n-type transistor; and
   a sixth p-type transistor coupled between the power terminal and a drain of the second p-type transistor, wherein the gate of the sixth p-type transistor is coupled to the gate of the fifth p-type transistor.

14. The level shifter circuit of claim 13, wherein the level shifter further comprises:
   a third n-type transistor coupled between the first p-type transistor and ground; and
   a fourth n-type transistor coupled between the second p-type transistor and ground.

15. The level shifter circuit of claim 12, wherein each of the inverters is configured to introduce a delay in the level shifter circuit.

16. The level shifter circuit of claim 12, wherein the level shifter further comprises:
   a third n-type transistor coupled between the first p-type transistor and ground, and a fourth n-type transistor coupled between the second p-type transistor and ground, wherein the fourth n-type transistor is gated by the input signal, wherein the gate of the first p-type transistor is coupled to a drain of the fourth n-type transistor, and wherein the gate of the second p-type transistor is coupled to the drain of the third n-type transistor.

17. The level shifter circuit of claim 12, wherein one or more transistors of the level shifter and the first current mirror are low voltage transistors and the level shifter circuit further comprising:
   at least one high voltage transistor coupled to a drain of a low voltage transistor and configured to control a voltage at the drain of the low voltage transistor.

18. An input/output (I/O) circuit comprising:
   a level shifter comprising:
   a first current mirror coupled between a power terminal and a ground terminal, wherein the first current mirror comprises a first n-type transistor gated by an input signal, and wherein the first current mirror is self-timed;
   a second current mirror coupled between the power terminal and the ground terminal, wherein the second current mirror comprises a second n-type transistor gated by an inverse of the input signal, and wherein the second current mirror is self-timed;
   a level shifter section, wherein the level shifter section includes a first transistor coupled to the first current mirror and a second transistor coupled to the second current mirror, and a high voltage transistor coupled to a drain of the first transistor and a second high voltage transistor coupled to the drain of the second transistor;
   a first shoot-thru current section comprising a first inverter and a second inverter directly coupled between a gate of the first transistor and the first current mirror; and
   a second shoot-thru current section comprising a third inverter and a fourth inverter directly coupled between a gate of the second transistor and the second current mirror.

19. The I/O circuit of claim 18, wherein the first n-type transistor and the second n-type transistor are low voltage transistors.

20. The I/O circuit of claim 18, wherein the first current mirror controls a voltage at a gate of the second transistor; and
   wherein the second current mirror controls the voltage at the gate of the first transistor.

* * * * *